United States Patent
Wittmann

(10) Patent No.: US 7,663,117 B2
(45) Date of Patent: Feb. 16, 2010

(54) RADIATION DETECTOR FOR DETECTING RADIATION

(75) Inventor: Georg Wittmann, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/664,031

(22) PCT Filed: Oct. 20, 2005

(86) PCT No.: PCT/EP2005/055416

§ 371 (c)(1),
(2), (4) Date: Sep. 8, 2008

(87) PCT Pub. No.: WO2006/045747

PCT Pub. Date: May 4, 2006

(65) Prior Publication Data

US 2009/0140156 A1    Jun. 4, 2009

(30) Foreign Application Priority Data

Oct. 28, 2004    (DE) .................. 10 2004 052 452

(51) Int. Cl.
*G01T 1/20* (2006.01)
(52) U.S. Cl. ................................. 250/370.11
(58) Field of Classification Search ............ 250/370.01, 250/370.09, 370.11, 370.12, 370.13
See application file for complete search history.

(56) References Cited

U.S. PATENT DOCUMENTS

| 5,262,649 | A |  | 11/1993 | Antonuk et al. |
| 5,930,591 | A |  | 7/1999 | Huang |
| 6,181,769 | B1 | * | 1/2001 | Hoheisel et al. ............ 378/98.8 |
| 6,483,099 | B1 | * | 11/2002 | Yu et al. .................. 250/214.1 |
| 7,148,486 | B2 |  | 12/2006 | Heismann et al. |
| 2003/0020020 | A1 | * | 1/2003 | Kobayashi et al. ...... 250/370.11 |

FOREIGN PATENT DOCUMENTS

| EP | 0 948 930 | 10/1999 |
| WO | WO 03/073507 | 9/2003 |

OTHER PUBLICATIONS

"Digitale Detektorsysteme für die Projektionsradiographie," Schultz, Fortschr. Röntgenstr., vol. 173 (2001) pp. 1137-1146.

* cited by examiner

*Primary Examiner*—David P Porta
*Assistant Examiner*—Mark R Gaworecki
(74) *Attorney, Agent, or Firm*—Schiff Hardin LLP

(57) ABSTRACT

A radiation detector for detecting radiation has a semiconductor layer on a substrate, the semiconductor layer being covered by a converter layer so that incoming radiation penetrates the converter layer preceding the semiconductor layer. The semiconductor layer forms a part of a detector array formed by a number of detector elements. The semiconductor layer is given increased sensitivity by being formed of a polycrystalline semiconductor material.

13 Claims, 2 Drawing Sheets

RADIATION DETECTOR FOR DETECTING RADIATION

BACKGROUND OF THE INVENTION

1. Field of the Invention

The invention concerns a radiation detector for acquisition of radiation of the type having a semiconductor layer on a substrate, overlaid with a converter layer, the semiconductor layer being a component of a detector array that includes a number of detector elements, for spatially-resolved detection of radiation that is incident on the detector array.

2. Description of the Prior Art

Radiation detectors for x-ray radiation are known from "Digitale Detektorsysteme für die Projektionsradiographie" from Fortschr. Röntgenstr. 2001 (RöFo 2001), volume 173, pages 1137 to 1146, Theime Verlag, Stuttgart. In the known radiation detectors a semiconductor layer accommodated on a substrate is overlaid by a converter layer. The semiconductor layer is produced from amorphous silicon and is a component of a detector array with a number of detector elements. A transistor is associated with each detector element as a switching element for serial acquisition of the signals. The analog signals exhibit a significant noise level. The noise level makes the acquisition of weak signals particularly difficult.

In order to expose the patient to less radiation, it is sought to keep the dose power low. As a consequence, the signals supplied by the detector elements are sometimes very weak. For an optimally precise acquisition of such weak signals it is necessary that the sensitivity of the detector elements being increased.

SUMMARY OF THE INVENTION

An object of the invention is to remedy the aforementioned disadvantages according to the prior art. In particular a radiation detector with an improved sensitivity that is optimally simple and cost-effective to produce should be specified.

This object is achieved in accordance with the invention by a radiation detector of the type initially described wherein the semiconductor layer is produced from a polycrystalline semiconductor material. Polycrystalline semiconductor material enables each detector element to be provided with a complex circuit for acquisition, conditioning and processing of the signals. Long signal paths as well as interferences associated therewith before the conditioning or processing of the signals can be avoided. The signals can be amplified and processed immediately after the formation. Weak signals can be acquired essentially without interferences, in particular without noise. The sensitivity of the radiation detector for acquisition of signals (in particular of weak signals) can be distinctly improved. The reaction times, switching times, down times and the like of the radiation detector can also be shortened.

The term "semiconductor layer" is used generally herein in the sense of the present invention. It can be a layer that is not continuous. The layer can be structured. It can include conducting and insulating segments next to one another and/or atop one another. The semiconductor layer in the sense of the present invention can also be a sequence of layers with different properties. Layers in the layer sequence can also exhibit insulating properties or include metallic conductors. The semiconductor layer can in particular include a number of integrated circuits, with each of the integrated circuits being associated with at least one pixel.

According to one embodiment the substrate is produced from glass. Glass is cost-effectively available. It is inert and can be processed without great expenditure. The semiconductor material is advantageously formed from silicon.

In a further embodiment, the semiconductor material exhibits an electron mobility of more than 50 cm$^2$/Vs, advantageously of more than 250 cm$^2$/Vs. Radiation detectors with a high sensitivity, short reaction times and short down times thus can be produced. Polycrystalline silicon with an electron mobility of more than 50 cm$^2$/Vs can, for example, be produced from amorphous silicon with a low temperature method, for example by exposure with a laser. Such polycrystalline silicon is also designated as low temperature polysilicon (LTPS). The electron mobilities of LTPS lie in the range from approximately 100 to 700 cm$^2$/Vs.

Even higher electron mobilities can be achieved with polycrystalline silicon in which the grains are even larger. Such polycrystalline silicon is also designated as continuous grain silicon (CGS). Electron mobilities of approximately 600 m$^2$/Vs and more can be achieved given CGS. The polycrystalline semiconductor materials LTPS and CGS can be produced over a large area, for example on a glass substrate. It is consequently possible to produce large-area radiation detectors with a high sensitivity.

In another embodiment of the invention, each detector element of the detector array includes an integrated circuit. The integrated circuit enables conditioning processing of the signals in the radiation detector. Long signal paths between acquisition and conditioning and processing can be avoided. Circuits as well as signal paths arranged outside of the detector array can be omitted or simplified. The integrated circuit enables an essentially low-noise conditioning and processing of the signals. The signals can be acquired, amplified and processed immediately after their formation. The sensitivity of the radiation detector can be distinctly improved.

The integrated circuit can be or include a circuit for processing of the signals or a circuit for filtering of the signals. For example, noise signals can be suppressed with the circuit for filtering. The signals so processed are particularly exact. The integrated circuit can also be or include a circuit for determination of the number of the radiation quanta generating a signal. Radiation incident on the radiation detector thus can be detected particularly precisely. The integrated circuit can also be or include a circuit for energy-resolved detection of radiation. Individual radiation quanta can be detected. With the proposed integrated circuits it is possible to implement a significant portion of the conditioning and processing of the signals in the detector element. The signals delivered from the proposed radiation detector can be processed further by a conventional evaluation electronic without further measures.

According to an embodiment of the invention, the substrate exhibits a thickness of 50 μm to 2000 μm. The semiconductor layer can exhibit a thickness in the range from 0.1 μm to 10 μm.

According to a further embodiment of the invention, the detector elements of the detector array are smaller than 1 mm, advantageously smaller than 300 μm. Such detector arrays exhibit spatial resolution of at least 0.5 line pairs for detection of radiation. The size of the detector array can be 2×2 cm to 50×50 cm. The size of the detector array is essentially merely limited by the manufacturable size of the polycrystalline semiconductor layers.

According to an embodiment of the invention, the converter layer is produced from a material for direct transduction of radiation into electrical charge signals. The converter layer can essentially be produced from selenium (Se) or cadmium telluride (CdTe).

According to a further embodiment, the converter layer is produced from a scintillator material. The scintillator material can, for example, be cesium iodide (CsI) or gadolinium oxisulfide. The scintillator material converts the radiation incident on the converter layer into light signals. A photodiode is provided in each detector element for acquisition and transduction of the light signals into electrical charge signals. The charge signals generated from these can be acquired and possibly conditioned and processed with circuits of the semiconductor layer. The photodiode can be a PIN diode. It is also possible for the photodiode to be an organic photodiode. The photodiodes can form a photodiode array which is arranged between the semiconductor layer and the converter layer. It is thereby possible to populate nearly the entire incident surface with photodiodes. This enables the realization of a particularly high filling factor, meaning that the quotient from detection surface and detector surface is particularly large. In this case each detector element can include a number of photodiodes whose signals are combined and relayed to an integrated circuit provided for the detector element.

DESCRIPTION OF THE PREFERRED EMBODIMENTS

Figure 1:
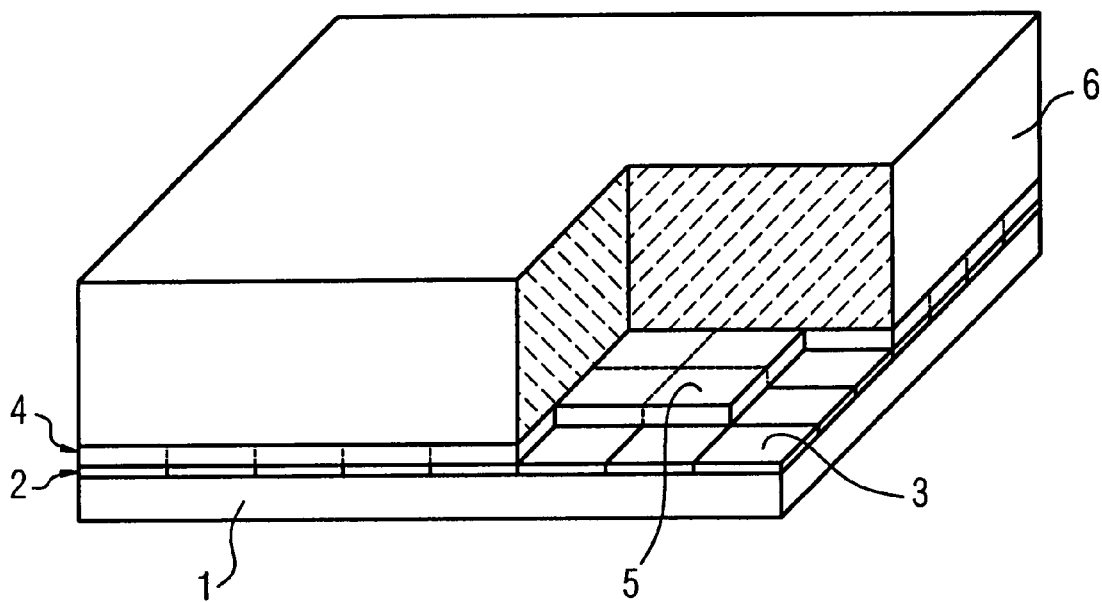
FIG. 1 schematically illustrates a first embodiment of a radiation detector according to the present invention.

FIG. 1 schematically shows a design of a first embodiment of a radiation detector. A polycrystalline semiconductor layer 2 is applied on a substrate 1 produced, for example, from glass. The semiconductor layer 2 comprises a circuit array with a number of integrated circuits 3 arranged like a chess board. A photodiode array 4 with a plurality of photodiodes 5 is mounted on the circuit array. The photodiodes 5 are essentially congruently arranged over the integrated circuits 3. A scintillator layer 6 (produced, for example, from gadolinium oxisulfide) is mounted on the photodiode array 4. Each integrated circuit, together with the photodiode 5 associated with it as well as a portion of the converter layer 6 located atop it, forms a detector D. Like the integrated circuits 3, the detectors D are arranged like a chess board and form a detector array.

Figure 2:
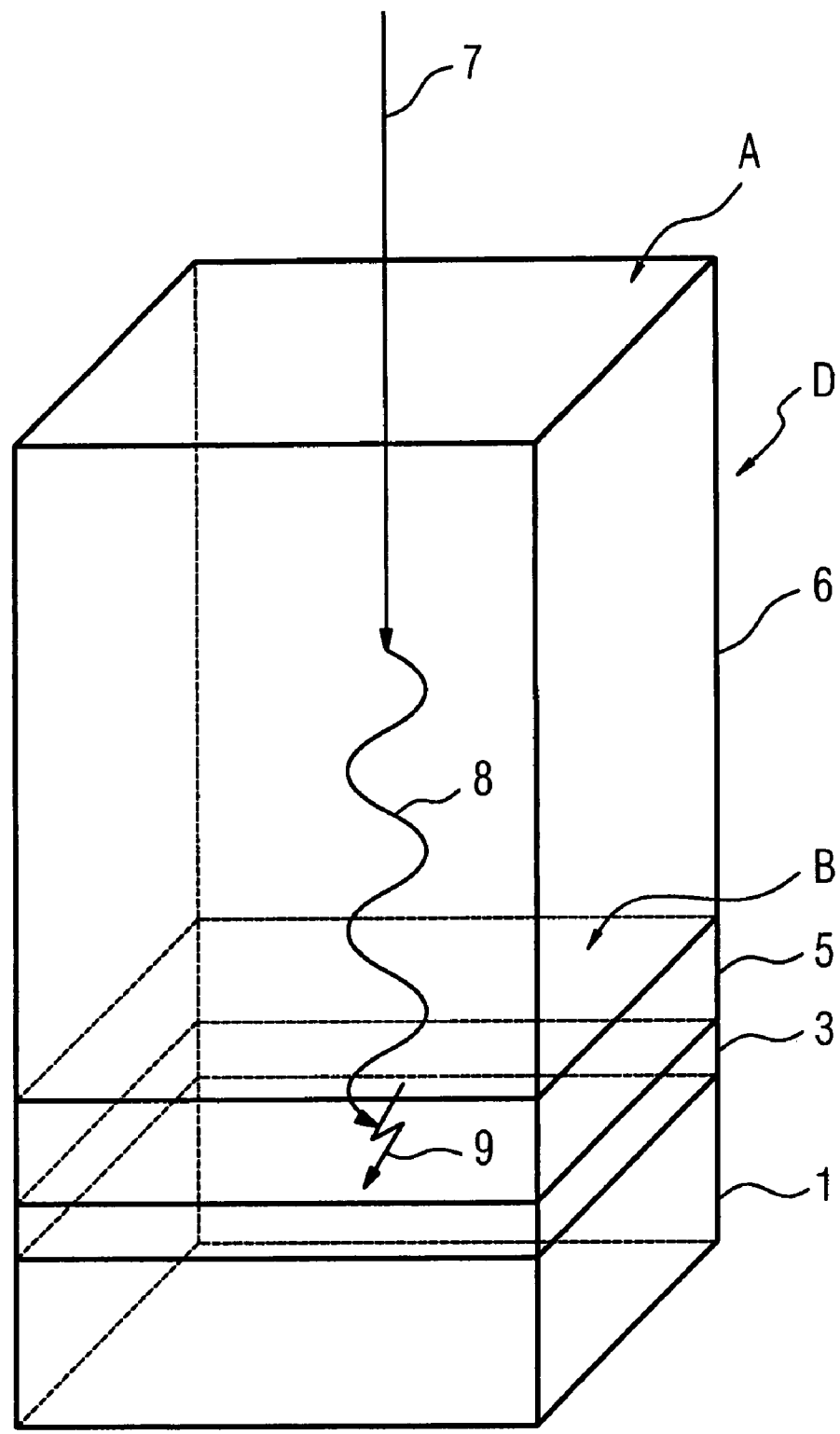
FIG. 2 schematically illustrates a detector element of the radiation detector of FIG. 1.

FIG. 2 schematically shows a detector element D of the detector array of the first radiation detector of FIG. 1. An integrated circuit 3 is accommodated on the substrate 1. A photodiode 5 is mounted on the integrated circuit 3. Radiation (for example x-ray radiation) incident on the scintillator layer 6 is designated with the reference character 7. A light signal 8 generated in the scintillator layer 6 is designated with the reference character 8. The light signal 8 is transduced by the photodiode 5 into an electrical charge signal 9. A detector surface facing the incident radiation is designated with A; a detection surface of the photodiode 5 that is available for acquisition of the light signals is designated with B.

The functioning of the detector of FIGS. 1 and 2 is as follows:

The radiation 7 incident on the scintillator layer 6 is converted into the light signal 8 in the scintillator layer 6. The scintillator layer 6 can be produced from materials such as, for example, CsI, CdTe or gadolinium oxisulfide. The light signal 8 generated via the photodiode 5 is conducted to the detection surface B of the photodiode 5. The photodiode 5 can, for example, be a PIN diode produced from silicon. The photodiode 5 can also be an organic photodiode. If an organic photodiode is used, the photodiode array can be mounted on the semiconductor layer 2 in a particularly simple manner, for example via a printing method. In the photodiode 5 the light signal 8 is transduced into an electrical charge signal 9. The charge signal 9 is detected by the integrated circuit 3. Semiconductor material such as, for example, LTPS or CGS produced from silicon can be used to produce the integrated circuit 3. The integrated circuit 3 can include circuits for processing or for filtering of the charge signals 9. With a filtering it is possible to acquire the radiation 7 essentially free of noise signals. It is also possible to provide circuits which enable a determination of the number of the radiation quanta generating a charge signal or enable an energy-resolved acquisition of the radiation 7. With such circuits it is possible to acquire, to condition and to process the charge signals 9 immediately after their formation and while preventing interferences. The sensitivity of the radiation detector and the quality of the acquisition of the radiation 7 can be distinctly improved.

The size of the detection surface B of the photodiode 5 essentially corresponds to the size of the detector surface A. The filling factor, i.e. the ratio of detection surface B to detector surface A, is approximately 1. Arranging the photodiode 5 over the integrated circuit 3 it avoids circuit elements (such as, for example, transistors) from having to be arranged in the detection surface. Circuit elements in the detection surface lead to an unwanted reduction of the filling factor. The arrangement or size of the integrated circuit 3 is limited only by the dimensions of the detector surface A.

Figure 3:
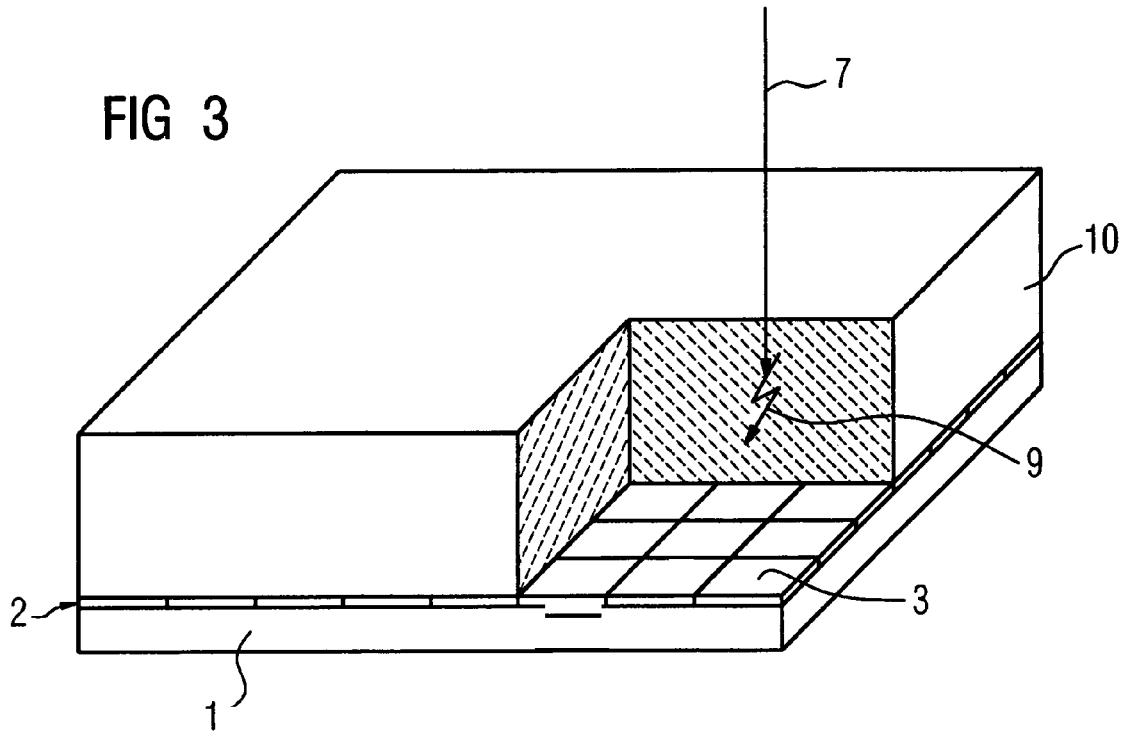
FIG. 3 schematically illustrates a second embodiment of a radiation detector according to the present invention.

FIG. 3 schematically shows a design of a second embodiment of a radiation detector. A polycrystalline semiconductor layer 2 is accommodated on a substrate 1. The semiconductor layer 2 comprises a circuit array with a plurality of integrated circuits 3 arranged like a chess board. A converter layer 10 for immediate transduction of a radiation 7 incident on the radiation detector into an electrical charge signal 9 is mounted on the circuit array. Such a converter layer 10 can be a layer produced from doped selenium or cadmium telluride, for example.

The functioning of the detector of FIG. 3 is as follows:

In the converter layer 10 the incident radiation 7 is transduced into an electrical charge signal 9 and detected by the integrated circuit 3. The detection, the conditioning or processing of the charge signal 9 can ensue analogous to the radiation detector of FIGS. 1 and 2. The difference between the radiation detector of FIGS. 1 and 2 and that of FIG. 3 is solely in the manner of the generation of the charge signals 9.

Although modifications and changes may be suggested by those skilled in the art, it is the invention of the inventor to embody within the patent warranted heron all changes and modifications as reasonably and properly come within the scope of his contribution to the art.

I claim as my invention:

1. A radiation detector for detecting radiation, comprising:
    a substrate;
    a semiconductor layer on said substrate, said semiconductor layer being produced of polycrystalline semiconductor material;
    a converter layer disposed over said semiconductor layer so that incoming radiation penetrates said converter layer preceding said semiconductor layer and being comprised of scintillator material; and
    said semiconductor layer being a component of a detector array comprising a plurality of detector elements for spatially-resolved detection of intensity of said incoming radiation, each of said detector elements comprising at least one organic photodiode that transduces light signals generated by said scintillator material into electrical charge signals, the respective organic photodiodes forming a photodiode array that is printed on said semiconductor layer.

2. A radiation detector as claimed in claim 1 wherein said substrate is comprised of glass.

3. A radiation detector as claimed in claim 1 wherein said semiconductor material is silicon.

4. A radiation detector as claimed in claim 3 wherein said semiconductor material has an electron mobility of more than 50cm$^2$/Vs.

5. A radiation detector as claimed in claim 4 wherein said semiconductor material has an electron mobility of more than 250cm$^2$/Vs.

6. A radiation detector as claimed in claim 1 comprising a plurality of integrated circuits respectively connected to each of said plurality of detector elements.

7. A radiation detector as claimed in claim 6 wherein said integrated circuits comprise at least one circuit selected from the group consisting of a processing circuit to process signals generated by the detector element connected thereto, and a filter circuit that filters signals from the detector element connected thereto.

8. A radiation detector as claimed in claim 1 wherein said substrate has a thickness in a range between 50 μm and 200 μm.

9. A radiation detector as claimed in claim 1 wherein said semiconductor layer has a thickness between 0.1 μm and 10 μm.

10. A radiation detector as claimed in claim 1 wherein each detector of said detector array has a quadruple shape having a side length of less than 1 mm in size.

11. A radiation detector as claimed in claim 10 wherein said side length is less than 300 μm.

12. A radiation detector as claimed in claim 1 wherein said detector array has a total size between 2×2 cm and 50×50 cm.

13. A radiation detector as claimed in claim 1 wherein said scintillator material is selected from the group consisting of cesium iodide and gadolinium oxisulfide.

* * * * *